United States Patent [19]

Haslett et al.

[11] Patent Number: 4,609,035
[45] Date of Patent: Sep. 2, 1986

[54] TEMPERATURE GRADIENT FURNACE FOR MATERIALS PROCESSING

[75] Inventors: Robert Haslett, Dix Hills; William Harwell, Coram, both of N.Y.

[73] Assignee: Grumman Aerospace Corporation, Bethpage, N.Y.

[21] Appl. No.: 705,826

[22] Filed: Feb. 26, 1985

[51] Int. Cl.$^4$ ............................................. F25B 29/00
[52] U.S. Cl. ........................................ 165/2; 165/27; 165/96; 165/61; 165/63
[58] Field of Search ..................... 165/27, 32, 61–64, 165/96, 48, 2

[56] References Cited

U.S. PATENT DOCUMENTS

| | | |
|---|---|---|
| 3,204,301 | 9/1965 | Flemings, Jr. et al. |
| 3,373,793 | 3/1968 | Smith |
| 3,516,487 | 6/1970 | Keiser |
| 3,517,730 | 6/1970 | Wyatt |
| 3,633,656 | 1/1922 | Saunders |
| 3,924,674 | 12/1975 | Basiulis ................................ 165/32 |
| 4,086,424 | 4/1978 | Mellen, Sr. |
| 4,162,700 | 7/1979 | Kahn |
| 4,162,701 | 7/1979 | Ollendorf ............................ 165/32 |
| 4,314,128 | 2/1982 | Chitre |
| 4,387,762 | 6/1983 | Rinderle ............................... 165/96 |
| 4,544,025 | 10/1985 | Aldrich et al. ....................... 165/30 |

Primary Examiner—Albert W. Davis, Jr.
Attorney, Agent, or Firm—Pollock, VandeSande & Priddy

[57] ABSTRACT

A cylindrically hollow segmented thermal gradient furnace enclosing metal or semiconductor material wherein each segment includes a heater for raising the temperature of the metal. The material is encircled by a heat pipe which is coupled to a heat exchanger for rapidly cooling a corresponding segment of the material after the heater has performed a thermal soak of the material. A reservoir is filled with inert gas which is selectively expanded to block cooling at the heat exchanger when the heater is turned on and compressed to allow cooling at the exchanger when the heater is turned off so that a sharp thermal gradient may be established along the length of the material.

11 Claims, 1 Drawing Figure

U.S. Patent  Sep. 2, 1986  4,609,035
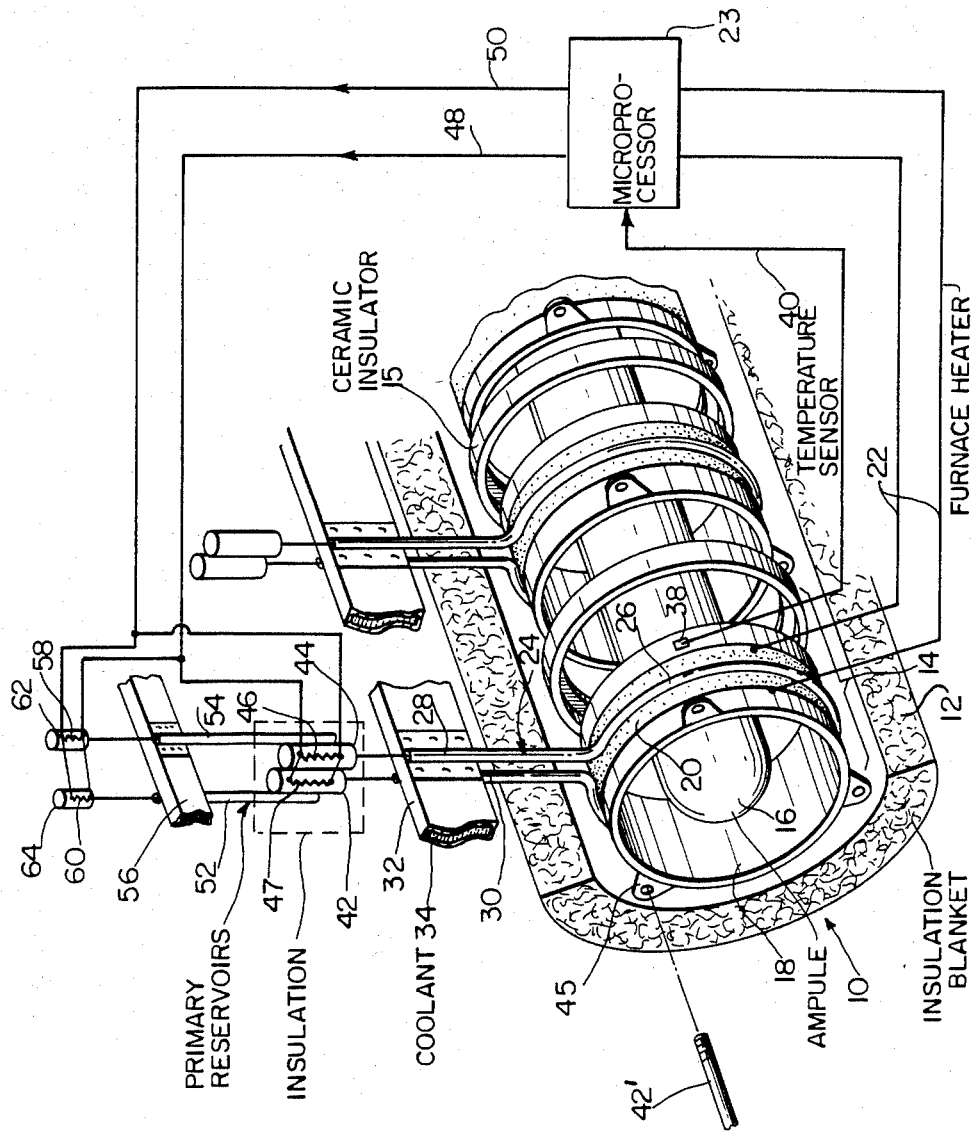

TEMPERATURE GRADIENT FURNACE FOR MATERIALS PROCESSING

FIELD OF THE INVENTION

The present invention relates to high temperature furnaces and more particularly to such a furnace capable of imposing a sharp temperature gradient movable along the length of a furnace for directional solidification of metals, semiconductors, etc. The invention incorporates variable conductance heat pipe technology that is free of mechanically moving parts.

BACKGROUND OF THE INVENTION

Directional solidification of metals and semiconductors requires high temperature to melt the material (typically 1000°–1500° C.) followed by the solidification of the material along a flat solidification surface (front) to achieve desired crystal growth. The solidification front is established by a sharp temperature gradient of a hundred degrees or so (somewhat above and below the melting point). The temperature gradient must then be moved axially along the sample to progressively solidify it. It is important that the gradient be established over the shortest possible distance with 1 inch or less being desired.

Currently two types of furnaces are in use. In one type the temperature gradient is established on the furnace wall and the sample is moved. This is mechanically complex and imposes starting and stopping acceleration on the sample which is undesirable. Therefore, the current preferred approach is to use a segmented furnace with individual programmable heaters. The furnace is covered with insulation and an external water cooling jacket. In operation the coolant is always flowing and the heaters are controlled to provide the desired axial temperature gradient profile.

From a power standpoint this is clearly a brute force approach. The thick insulation cannot be too efficient since individual segments of the furnace must cool rapidly when power is reduced in order to move the temperature gradient at the desired velocity. Therefore, high power is required because of the large (and constant) heat leak through the insulation to the coolant (typically water). The high power consumption of current furnace designs precludes them from large scale application in space where major improvements in material quality are believed obtainable due to the absence of gravitation forces. Such major improvements occur from the elimination of convective flow in the melt at the solidification interface which provides a more homogeneous material.

BRIEF DESCRIPTION OF THE INVENTION

The present invention utilizes a multi segment furnace which receives an axially disposed ampule that holds semiconductor material or metal therein. A plurality of adjacently and axially spaced heat pipes are individually controlled by a microprocessor to create a preprogrammed temperature gradient along the length of the ampule. The treated material may be temperature soaked for a prolonged period of time and then rapidly cooled by quickly changing the conductance of each heat pipe to create a rapidly moving gradient along the length of the ampule. Utilization of variable conductance heat pipe technology improves the sharpness of the temperature gradient and achieves a major reduction in heater power which is particularly important for zero g processing.

The furnace of the present invention includes no moving parts so that it has a protracted life expectancy which is quite important for space applications. The invention disclosed herein reduces the power consumption to virtually any desired value after properly optimizing design parameters since the furnace is coupled to a coolant loop by variable conductance heat pipes that exhibit high conductance when cooling is desired but shut off to a very low value at all other times. The segmented design of the invention incorporates low conductivity ceramic insulators between the identical segments to prevent axial heat leak thereby allowing the establishment of a sharp temperature gradient. Each identical segment, typically ½ inch–¾ inch, contains a heater encircling the material containing ampule with a temperature sensor in close proximity to monitor segment temperature. After the heater heats the material, variable conductance pipes in each segment are controlled by a microprocessor to achieve rapid cooling along a respective segment.

Effective insulation is employed to surround the furnace. All the heater power is used to warm up the furnace with only a minimal heat leak through the insulation. Minimizing heater power is a critical cost consideration for any high volume materials processing particularly if performed in space.

The heat pipes are controlled by a microprocessor controlled heated gas reservoir which selectively interferes with heat exchange by the heat pipes. Control of the thermal exchange is easily and precisely accomplished and, it can be fabricated into a relatively small package, which is extremely attractive for space applications.

BRIEF DESCRIPTION OF THE FIGURE

The above-mentioned objects and advantages of the present invention will be more clearly understood when considered in conjunction with the accompanying drawing, in which:

The FIGURE is a partially disassembled perspective view of the present furnace.

DETAILED DESCRIPTION OF THE INVENTION

In the FIGURE reference numeral 10 generally indicates the temperature gradient furnace of the present invention which is employed to process semiconductor materials and metals. The present construction is particularly suited for space applications. An insulation blanket 12 of cylindrical configuration encloses the interior furnace components. The insulation may be of conventional design. Segment 14 indicates a unit of the furnace which is repeated along the length of a material enclosing ampule 16 disposed along the axis of the furnace. The individual segments 14 are separated by intervening low conductance insulator rings to prevent axial heat leak along the furnace thereby allowing the establishment of a sharp temperature gradient therealong. A typical material for the insulator rings is ceramic. The ampule 16 is of conventional design and is made from a material which is compatible with the semiconductor or metal material contained by the ampule and must, of course, be capable of withstanding the temperature range of the furnace. Considering the leftmost segment 14 of the furnace, a cylindrical support 18 has furnace heater coil 20 wrapped around the outer periphery thereof. Wires 22 are connected between the coil and a microprocessor 23 which controls the heating cycle of the coil. A conductive heat pipe loop generally indicated by reference numeral 24 encircles the exterior of the heater coil 20. More particularly, the loop is comprised of two symmetrical pipes 28 and 30 fastened around furnace coil 20 as indicated at 26. The pipes 28 and 30 are arranged in transverse coplanar relation to each other and may be continuous or separated at the lower extremities thereof. They are thermally coupled to heat exchanger 32 which contains an appropriate coolant 34. During a heating cycle microprocessor 23 energizes the furnace coil 20 thereby heating up ampule 16 in segment 14. A temperature sensor 38 is appropriately secured to the cylindrical support 18 and is connected, via wire 40, to microprocessor 23 so that a heat sensing and heater coil feedback loop is completed. Reservoirs 42 and 44 respectively communicate with heat pipes 30 and 28. During the time when heater coil 20 is energized, reservoir heaters 46 and 47 are likewise energized by microprocessor connecting wires 48 and 50 thereby causing inert gas in the reservoirs 42 and 44 to expand into the pipes 30 and 28 thus interferring with the furnace cooling heat exchange between the heat pipe fluid and exchanger coolant. Accordingly, only heating during this period of time will occur.

When furnace cooling is to be affected, microprocessor 23 terminates energization of heater coil 20 as well as reservoir heaters 46 and 47. As a result the inert gas compresses and returns to reservoirs 46 and 47. The liquid wicked inside the heat pipes 28 and 30 is now free to exchange heat with coolant 34. Rapid cooling of segment 14 and consequently the ampule-contained material results.

The heat pipes for high temperature applications would generally use sodium, lithium or potassium working fluid while an inert gas such as helium or argon is contained in the reservoirs for control. To establish different temperature gradients and solidification front velocities, the heaters on the individual segments are accurately controlled by programmable microprocessor 23. A typical processing sequence is as follows:

The furnace heater coil 20 of all segments is energized to bring the material within ampule 16 to the desired uniform temperature above the melting point. The reservoir heaters in all the segments are energized to block the heat pipes and prevent heat transfer from the furnace to the coolant. Effective insulation in the form of blanket 12 surrounds the furnace so total heat leak is very low. All the heater power is used to warm up the furnace. The warm-up time can be selected to stay within watt limit constraints. The total watt-hours required is a function of furnace and sample mass. Furnace mass will be minimized.

The desired gradient and gradient velocity is established by stopping the heat inputs to the reservoirs and furnace heaters on each segment sequentially. The segment cools when its heat pipes are now coupled to the coolant. When a segment drops to its lower desired temperature, the furnace and reservoir heaters are again turned on. The furnace heater now requires a very low wattage input just sufficient to compensate for the heat leak through the insulation (of the solid portion of the material in the ampule). From the above-described sequence, it is clear that the actual program for microprocessor 23 is quite simple and straightforward.

It can be seen from the above description that this invention requires the minimum amount of heater power which is an expensive item for any high volume materials processing and is especially critical for space processing. Wasted energy in this invention is limited to (1) the heat leak through the insulation blanket 12 which can be minimized to any extent desired by proper selection of insulation type and thickness and (2) the heat leak from the heated gas reservoirs 42 and 44. This can be minimized by proper reservoir sizing and if need be can be virtually eliminated by utilizing variable conductance heat pipes in series. In this latter-mentioned version auxiliary heat pipes would control the reservoir temperature of the main heat pipes 28 and 30 similar to a pilot operated control value. The heat pipes of such an alternative version would have much smaller gas reservoirs than 42 and 44 shown in the FIGURE and, hence, lower heat leak.

A more detailed explanation of this alternative version is now offered with reference to the FIGURE. The primary reservoirs 42 and 44 are surrounded by insulation so that little power need be introduced to heaters 46 and 47 during a furnace heating cycle in which inert gas in the primary reservoirs 42 and 44 is heated to cause expansion as previously explained. However, since the insulation prevents cooling of the reservoirs and thus the inert gas during a cooling cycle, the auxiliary reservoirs 62 and 64 are employed to transfer the heat from the primary reservoirs 42 and 44 during a cooling cycle. To accomplish this, additional heat pipes 52 and 54 are mounted to the primary reservoirs 42 and 44. The heat pipes are physically mounted to a second heat exchanger 56 which may be similar to the previously described heat exchanger 32, but may be substantially smaller in size due to the smaller size since only reservoirs 42 and 44 are being cooled, not the furnace. Electrical heaters 58 and 60 are located on the non-insulated auxiliary reservoirs 62, 64 and are connected to microprocessor output wires 48, 50 so that these heaters are turned on and off simultaneously with heaters 46 and 47 of the primary reservoirs. In operation of this alternative version of the invention during a heating cycle, inert gas from the primary and auxiliary reservoirs blocks the loss of furnace heat to coolant within heat exchangers 32 and 56. When rapid cooling is required, heaters 58 and 60 of the auxiliary reservoirs are turned off so that the inert gas is compressed into reservoirs 62 and 64 thereby allowing a cooling heat exchange between heat pipes 52, 54 and the exchanger 56. The result of this heat exchange is the cooling of reservoirs 42 and 44 so that the inert gas associated with these primary reservoirs is compressed thereby permitting heat transfer between heat pipes 28, 30 and exchanger 32. This cooling heat exchange then permits rapid cooling of the furnace. The alternative version may be expanded so that additional series auxiliary reservoirs are connected to reservoirs 62 and 64 illustrated. The end result of such a series configuration is a reduction of the power supplied for heating the primary reservoir due to its insulation. The auxiliary reservoirs are relied upon for achieving rapid cooling which would not be possible by employing insulated primary reservoirs by themselves.

The FIGURE illustrates a version of the invention that has a heater coil 20 completely around each furnace segment. Another advantage of the heat pipe system is that this is not necessary. A heater anywhere on the heat pipe evaporator (length that surrounds the furnace) is acceptable since the heat pipe will serve to isothermalize the furnace. This increases the options available for heater size and placement and also eliminates local hot spots due to uneven heater distribution. An important requirement for a materials processing furnace is uniform temperature around the circumference.

In order to fasten the individual segments of the furnace together in abutting coaxial relationship, fasteners 42' are passed through lugs 45 on each cylindrical support 18 and appropriately secured. This modular construction permits joining as many segments as desired to construct furnaces of varying lengths for different applications. Also, there are no restrictions on furnace diameter for either ground or space operation. The orientation shown, with the coolant located above the heat source (furnace) will operate on the ground independent of heat pipe wicking since the condensate in the heat pipe will return to the heat source end by gravity. For space application suitable wicking, which is well known technology, will be provided in the heat pipes.

It should be understood that the invention is not limited to the exact details of construction shown and described herein for obvious modifications will occur to persons skilled in the art.

We claim:

1. A thermal gradient furnace having a plurality of axially adjacent independently controlled segments, each segment comprising:
   a material container positioned axially;
   an annular support for mounting at least one heat pipe therearound and coaxially enclosing the container;
   heat exchange means thermally connected to the heat pipe for cooling the furnace and consequently the material;
   means connected to the heat pipe for selectively blocking thermal conductance between the heat exchange means and the pipe thereby preventing cooling of the material;
   heating means encircling the container for selectively heating the material therein;
   thermal sensing means located in proximity to the material container for sensing thermal conditions in the furnace; and
   preprogrammed means connected at its input to the sensing means and at individual outputs to the conductance blocking means and the heating means for controlling heating and cooling cycles of each segment thus creating a sharp thermal axial gradient along the length of the material.

2. The structure set forth in claim 1 wherein the conductance blocking means comprises:
   reservoir means containing an inert gas; and
   second heating means associated with the reservoir means for expanding the gas into the heat pipe thus blocking heat exchange between coolant in the heat exchange means and a fluid present in the heat pipe.

3. The structure set forth in claim 1 together with insulation means axially positioned between adjacent segments.

4. The structure set forth in claim 1 wherein the heating means is an electrical heating coil mounted around the support; and further wherein the heat pipe is also mounted around the support.

5. The structure set forth in claim 1 wherein the reservoir means is insulated for reducing heat loss therefrom; and further wherein an auxiliary heat pipe is positioned adjacent the reservoir means;
   second heat exchange means thermally connected to the auxiliary heat pipe for conducting heat from the reservoir means during a furnace cooling cycle;
   auxiliary reservoir means smaller than the insulated reservoir means and containing inert gas, the auxiliary reservoir connected to the auxiliary heat pipe;
   means connecting the preprogrammed means to the third heating means associated with the auxiliary reservoir means for expanding the gas therein into the auxiliary heat pipe thus selectively blocking cooling heat exchange between the second heat exchange means and the auxiliary heat pipe which consequently blocks cooling of the insulated reservoir means during a furnace heating cycle.

6. The structure set forth in claim 2 together with insulation means axially positioned between adjacent segments.

7. The structure set forth in claim 6 wherein the heating means is an electrical heating coil mounted around the support; and further wherein the heat pipe is also mounted around the support.

8. A method for creating sharp thermal gradients along the length of metal or semiconductor material, comprising the steps:
   defining a plurality of contiguous axial thermal segments;
   encircling the material with at least one heat pipe thermally communicating with a heat exchanger;
   selectively expanding inert gas into the heat pipe for blocking heat exchange between fluid in the heat pipe and coolant in the exchanger when heating the material;
   thermally soaking the material for a preselected period;
   compressing the inert gas for removing it from the heat pipe thereby enabling rapid cooling of the material associated with the segment;
   preprogramming the cooling cycles for each segment to create sharp thermal gradients along the entire length of the material.

9. The method set forth in claim 8 together with the step of thermally sensing the temperature at each segment to provide temperature data to a preprogrammed controller which independently controls the heating and cooling cycles of each segment to create the sharp thermal gradients.

10. The method set forth in claim 8 wherein the inert gas is stored in a reservoir and further wherein the steps of expanding and compressing the inert gas respectively require the heating and cooling thereof.

11. The method set forth in claim 9 wherein the inert gas is stored in a reservoir and further wherein the steps of expanding and compressing the inert gas respectively require the heating and cooling thereof.

* * * * *